United States Patent
Suzuki et al.

(10) Patent No.: US 7,019,454 B2
(45) Date of Patent: Mar. 28, 2006

(54) LIGHT EMITTING DEVICE

(75) Inventors: Gen Suzuki, Yamagata-ken (JP);
Masatoshi Yamaki, Yamagata-ken (JP);
Yoichi Munekata, Yamagata-ken (JP);
Naoki Yazawa, Yamagata-ken (JP)

(73) Assignee: Tohoku Pioneer Corporation, Yamagata-ken (JP)

( * ) Notice: Subject to any disclaimer, the term of this patent is extended or adjusted under 35 U.S.C. 154(b) by 0 days.

(21) Appl. No.: 10/287,684

(22) Filed: Nov. 5, 2002

(65) Prior Publication Data
US 2004/0056585 A1    Mar. 25, 2004

(30) Foreign Application Priority Data
Jul. 31, 2002 (JP) .............................. 2002-223250

(51) Int. Cl.
*H05B 33/00* (2006.01)
*H01J 1/62* (2006.01)

(52) U.S. Cl. .................. 313/495; 313/504; 313/506; 313/497

(58) Field of Classification Search ............... 313/510, 313/501, 506, 511, 512, 495, 497, 493, 581, 313/584
See application file for complete search history.

(56) References Cited

U.S. PATENT DOCUMENTS

| | | | | |
|---|---|---|---|---|
| 3,027,668 A | * | 4/1962 | Hardesty | 313/510 |
| 6,091,195 A | * | 7/2000 | Forrest et al. | 313/504 |
| 6,125,226 A | * | 9/2000 | Forrest et al. | 313/506 |
| 6,181,062 B1 | * | 1/2001 | Hiraishi et al. | 313/506 |
| 6,520,821 B1 | * | 2/2003 | Ishii et al. | 313/512 |

* cited by examiner

*Primary Examiner*—Ashok Patel
(74) *Attorney, Agent, or Firm*—Arent Fox PLLC

(57) ABSTRACT

A transparent electrode layer, an organic EL layer, and a metallic electrode layer are stacked on top of each other in layers on the lower surface of a transparent substrate to form a planar light emitting element region in a light emitting device. A light beam which is emitted from the light emitting element region and incident on the transparent substrate is transmitted out from a display region as well as a light transmitting region formed near an edge of the transparent substrate. Thus, the light emitting device is enabled to facilitate fabrication and make an effective use of the entire surface of the transparent substrate as the light transmitting region.

16 Claims, 9 Drawing Sheets

LIGHT EMITTING DEVICE

BACKGROUND OF THE INVENTION

1. Field of the Invention

The present invention relates to light emitting devices and more particularly to a light emitting device which has planar light emitting element regions formed on a transparent substrate.

The present application claims priority from Japanese Patent Application No. 2002-223250, the disclosure of which is incorporated herein by reference for all purposes.

2. Description of the Related Art

Among light emitting devices used as display devices or the like, a variety of light emitting devices have been suggested which have a planar light emitting element region formed in a predetermined area on a transparent substrate to emit light through the transparent substrate. Such a light emitting device has a light emitting element region formed at each region for transmitting light out therethrough (light transmitting region) on the transparent substrate, and is provided with a plurality of light transmitting regions formed as required on the transparent substrate (see Japanese Patent Laid-Open Publications No. 2001-265270 and No. 2001-267084).

By way of example, FIG. 1 illustrates a conventional light emitting device. The light emitting device has a transparent substrate 1, such as a glass substrate or a transparent plastic substrate, on which successively deposited are the following layers. That is, the layers include a transparent electrode layer 2 (first electrode layer) which is formed of ITO film or the like and serves as the anode, an insulative layer 4 formed on the transparent electrode layer 2, an organic light emissive layer 5 made of a predetermined organic material, and a metallic electrode layer 6 (second electrode layer) which is formed of Al or the like and serves as the cathode. With this configuration, a voltage is applied between the transparent electrode layer 2 and the metallic electrode layer 6 to cause the organic light emissive layer 5 disposed between these electrode layers to emit light, which is in turn transmitted out through the transparent substrate.

In this light emitting device, its display portion is divided into two parts: the first to fourth display portions A–D and a supplementary display portion E, all of which are arranged in a longitudinal direction of the transparent substrate. To form each of the display portions, the transparent electrode layer 2 having display patterns (display pattern portions 2A–2E) are patterned on the transparent substrate 1. These display pattern portions 2A–2E are individually connected to a leadframe (not shown), provided on an edge of the transparent substrate 1, via wiring portions (not shown) formed with the transparent electrode layer 2.

The insulative layer 4 is formed to cover the aforementioned wiring portions except for the display pattern portions 2A–2E on the transparent electrode layer 2. This insulative layer 4 prevents a voltage from being applied to the organic light emissive layer 5 at the portion corresponding to the aforementioned wiring portions, thereby preventing light emission from this portion. The organic light emissive layer 5 is formed so as to cover the display pattern portions 2A–2E on the entire surface of the transparent substrate 1 including the insulative layer 4, with the metallic electrode layer 6 being further formed on the entire surface thereof.

The light emitting device having such a configuration is intended to provide improved functionality or design for the light emitting device by forming a plurality of display portions on a single substrate.

According to such a conventional light emitting device, the light emitting element region including the first electrode layer, the light emissive layer, and the second electrode layer is formed at each light transmitting region on the surface of the transparent substrate. With this configuration, to provide a light emission in a form required, it is necessary to pattern transparent electrode layers or the like in accordance with the requirements thereof, thereby causing an increase in complication of the fabrication process.

Additionally, since the lead frame or the like is formed in the light emitting device, it is difficult to form a light emitting element region near an edge of the transparent substrate in the conventional light emitting device. This makes it impossible to form a light transmitting region near the edge of the transparent substrate, thereby presenting a problem that an effective use cannot be made of the entire surface of the transparent substrate as a light transmitting region.

Furthermore, among light beams emitted from the light emitting element region formed on the transparent substrate, a light beam which is generally perpendicularly incident on the transparent substrate can be transmitted out through the transparent substrate. However, those light beams which are incident upon the transparent substrate at some angles are not to be transmitted out from the light transmitting region of the transparent substrate, thereby presenting another problem that full use cannot be effectively made of the light emitted from the light emitting element region.

SUMMARY OF THE INVENTION

The present invention was developed to address the aforementioned problems. The objects of the present invention are therefore to facilitate the fabrication, make an effective use of the entire transparent substrate as a light transmitting region, and of light emitted from the light emitting element region, and also facilitate formation of the light transmitting region with ease, so that an improved functionality and design of the light emitting element can be achieved.

To achieve those objects, a light emitting device according to the present invention has the following aspects.

A light emitting device according to the first aspect of the present invention includes a first electrode layer, a light emissive layer, and a second electrode layer, the layers being deposited on a transparent substrate to form a planar light emitting element region on the transparent substrate. The light emitting device is characterized in that at a region other than a region opposite to the light emitting element region on a surface of the transparent substrate, a light transmitting region for transmitting out light having been emitted from the light emitting element region and having been propagated through the transparent substrate is formed.

A light emitting device according to the second aspect of the present invention includes a first electrode layer, a light emissive layer, and a second electrode layer, the layers being deposited on a transparent substrate to form a planar light emitting element region on the transparent substrate. The light emitting device is characterized in that on a surface of the transparent substrate, a display region is formed at a region opposite to the light emitting element region, and in addition to the display region, a light transmitting region for transmitting light out which has been emitted from the light emitting element region and which has been propagated through the transparent substrate is formed.

A light emitting device according to the third aspect of the present invention includes a first electrode layer, a light emissive layer, and a second electrode layer, the layers being deposited on a first transparent substrate to form a planar light emitting element region on the first transparent substrate. The light emitting device is characterized in that at a region other than a region opposite to the light emitting element region on a surface of a second transparent substrate mounted on the first transparent substrate, a light transmitting region for transmitting out light having been emitted from the light emitting element region is formed.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Now, the present invention will be explained below in more detail with reference to the accompanying drawings in accordance with the following embodiments.

Figure 1:
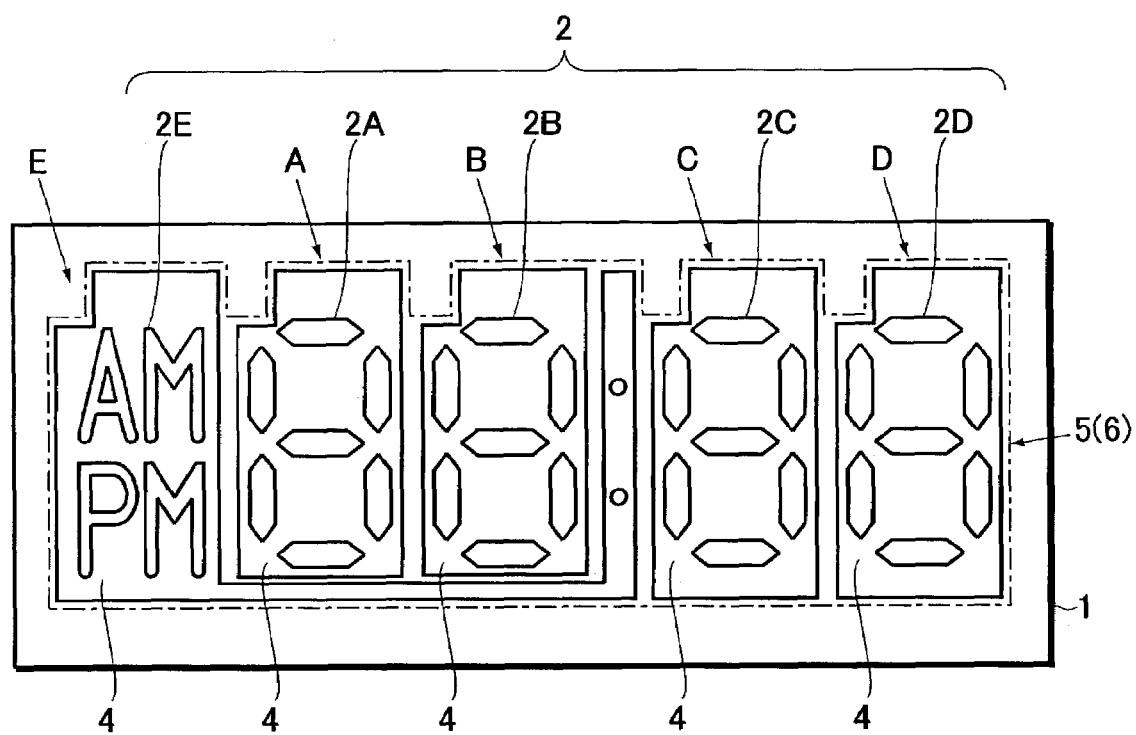
FIG. 1 is an explanatory view illustrating a conventional light emitting device.
Figure 2:
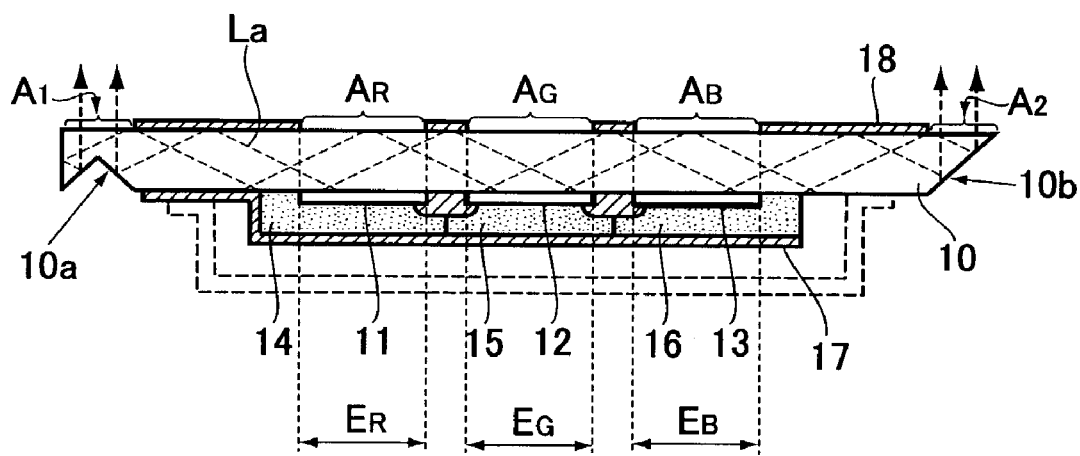
FIG. 2 is an explanatory view illustrating a light emitting device according to an embodiment of the present invention.

FIG. 2 is an explanatory view illustrating a light emitting device according to one embodiment of the present invention. According to the first characteristic of the present invention, a light emitting device of this embodiment includes first electrode layers 11, 12, 13 defined side by side on a transparent substrate 10, light emissive layers 14, 15, 16 which are deposited on the first electrode layers 11, 12, 13, respectively, with a second electrode layer 17 being further deposited thereon, thereby being provided with planar light emitting element regions $E_R$, $E_G$, $E_B$ formed on the transparent substrate 10. Formed at regions other than regions opposite to the light emitting element regions $E_R$, $E_G$, $E_B$ on a surface of the transparent substrate 10 are light transmitting regions $A_1$, $A_2$ for transmitting light La out which has been emitted from the light emitting element regions $E_R$, $E_G$, $E_B$ and which has been propagated through the transparent substrate 10.

According to the second characteristic of the present invention, on the precondition of the light emitting device having the first characteristic, a part or all of the regions on the surface of the transparent substrate 10 except for the light transmitting regions $A_1$, $A_2$ is coated with a reflective coating 18.

According to the third characteristic of the present invention, a light emitting device includes first electrode layers 11, 12, 13 defined side by side on a transparent substrate 10, light emissive layers 14, 15, 16 which are deposited on the first electrode layers 11, 12, 13, respectively, with a second electrode layer 17 being further deposited thereon, thereby being provided with planar light emitting element regions $E_R$, $E_G$, $E_B$ formed on the transparent substrate 10. On a surface of the transparent substrate 10, display regions $A_R$, $A_G$, $A_B$ are formed on regions opposite to the light emitting element regions $E_R$, $E_G$, $E_B$, and in addition to the display regions, light transmitting regions $A_1$, $A_2$ for transmitting light out which has been emitted from the light emitting element regions $E_R$, $E_G$, $E_B$ and which has been propagated through the transparent substrate 10 are formed.

According to the fourth characteristic of the present invention, a light emitting device comprises the aforementioned first electrode layers 11, 12, 13 defined side by side on a first transparent substrate, the light emissive layers 14, 15, 16 which are deposited on the first electrode layers 11, 12, 13, respectively, with the second electrode layer 17 being further deposited thereon, thereby being provided with the planar light emitting element regions $E_R$, $E_G$, $E_B$ formed on the first transparent substrate. To the first transparent substrate, attached is a second transparent substrate on which the aforementioned light transmitting regions $A_1$, $A_2$ are formed. That is, the light emitting device is characterized in that at a region other than the regions opposite to the light emitting element regions $E_R$, $E_G$, $E_B$ on a surface of the second transparent substrate, light transmitting regions $A_1$, $A_2$ are formed which transmit light La to have been emitted from the light emitting element regions $E_R$, $E_G$, $E_B$ out.

According to the fifth characteristic of the present invention, on the precondition of the aforementioned light emitting devices, the light transmitting regions $A_1$, $A_2$ are formed near an edge of the transparent substrate 10.

According to the sixth characteristic of the present invention, on the precondition of the aforementioned light emitting devices, the light transmitting regions $A_1$, $A_2$ are constituted by a groove 10a or a cut face 10b which is formed on the transparent substrate 10.

According to the seventh characteristic of the present invention, on the precondition of the aforementioned light emitting devices, the light transmitting regions $A_1$, $A_2$ are linearly shaped to form linear light sources of light beams transmitted out from the light transmitting regions $A_1$, $A_2$.

According to the eighth characteristic of the present invention, on the precondition of the aforementioned light emitting devices, the light emitting element regions $E_R$, $E_G$, $E_B$ are each defined as a plurality of light emitting element regions each having a different color, and light beams emitted from each of the light emitting element regions $E_R$, $E_G$, $E_B$ are combined to be transmitted out through the light transmitting regions $A_1$, $A_2$.

According to the ninth characteristic of the present invention, on the precondition of the aforementioned light emitting device, an emission of light from each of the light emitting element regions $E_R$, $E_G$, $E_B$ is controllably turned on or off to make a combined color adjustable, the combined color being provided by light beams transmitted out through the light transmitting regions $A_1$, $A_2$.

According to the tenth characteristic of the present invention, on the precondition of the aforementioned light emitting devices, each of the light emissive layers 14, 15, 16 is an organic electroluminescence layer (hereinafter referred to as organic EL layer).

The light emitting devices having such characteristics provides the following operations. That is, according to the first characteristic, on a surface of the transparent substrate 10, formed are the light transmitting regions $A_1$, $A_2$ for transmitting light out which has been emitted from the light emitting element regions $E_R$, $E_G$, $E_B$ and has been propagated through the transparent substrate 10. This enables it to transmit the light out from portions different from the position of the light emitting element regions $E_R$, $E_G$, $E_B$ and to make an effective use of the entire surface of the transparent substrate as a light transmitting region, thereby allowing the light emitting device to achieve improved functionally and design thereof.

Furthermore, among light beams emitted from the light emitting element regions $E_R$, $E_G$, $E_B$, use is made of a light beam which has been incident diagonally on the substrate surface and has been propagated through the transparent substrate 10 in order to form the light transmitting regions $A_1$, $A_2$, thereby enabling it to make an effective use of the light emitted from the light emitting element regions $E_R$, $E_G$, $E_B$. As described as the second characteristic, this advantage can be further enhanced by applying the reflective coating 18 to part or all of the regions on the surface of the transparent substrate 10 except for the light transmitting regions $A_1$, $A_2$.

According to the third characteristic, on a surface of the transparent substrate 10, the display regions $A_R$, $A_G$, $A_B$ are formed at the regions opposite to the light emitting element regions $E_R$, $E_G$, $E_B$, and in addition to the display regions, the aforementioned light transmitting regions $A_1$, $A_2$ are formed. This enables it to make use of the display regions to provide various display, also allowing the light transmitting regions $A_1$, $A_2$ to serve as a supplementary display or as an additional light source.

According to the fourth characteristic, the first transparent substrate having the light emitting element regions $E_R$, $E_G$, $E_B$ formed thereon is prepared separately from the second transparent substrate having the light transmitting regions $A_1$, $A_2$ formed thereon, thereby enabling it to facilitate machining or the like of the second transparent substrate on which the light transmitting regions $A_1$, $A_2$ are formed.

According to the fifth characteristic, it is made possible to transmit light out from near an edge of the transparent substrate 10 at which it is difficult to form a light emitting element region, thereby enabling the entire surface of substrate to be effectively used.

According to the sixth characteristic, a light transmitting region can be provided at the edge side only by forming the groove 10a or the cut face 10b on the substrate surface, thereby facilitating the fabrication when compared with the case of forming a light emitting element region for the respective light transmitting regions.

According to the seventh characteristic, the light transmitting regions $A_1$, $A_2$ are linearly formed near an edge of the substrate, there making it possible to transmit linear light beams out by making an effective use of the width of the transparent substrate and thus providing a linear light source which can be used for various applications.

According to the eighth characteristic, light beams emitted from each of the light emitting element regions $E_R$, $E_G$, $E_B$ each having a plurality of different colors are combined to be transmitted out through the light transmitting regions $A_1$, $A_2$, thereby enabling it to transmit a light beam having a combined color of those from each of the light emitting element regions or a white color out.

According to the ninth characteristic, an emission of light from each of the light emitting element regions is controllably turned on or off, thereby enabling it to appropriately adjust the color of light transmitted out from the single color of each light emitting element region through their combined colors to white.

Finally, according to the tenth characteristic, the aforementioned light emissive layers can be formed of an organic EL layer, thereby providing the organic EL display device with a supplementary display portion or multi-functional light source near an edge of the transparent substrate. This structure enables it to provide improved functionality and design to the organic EL display device.

EXAMPLES

Figure 3:
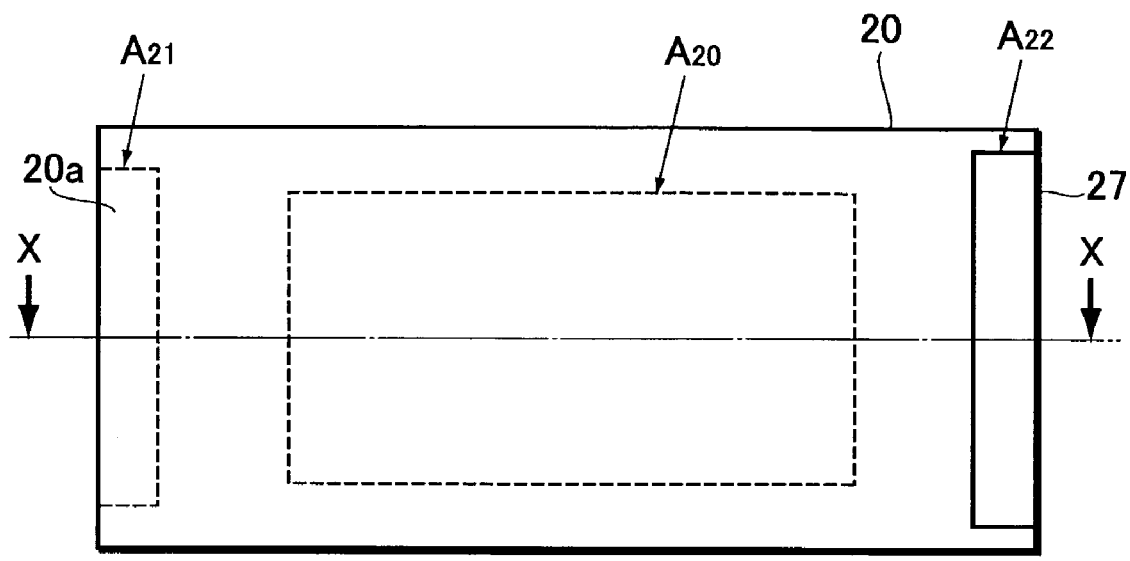
FIGS. 3(a) and 3(b) are explanatory views illustrating a light emitting device according to an example of the present invention, FIG. 3(a) showing a plan view of the light emitting device and FIG. 3(b) showing a cross-sectional view taken along the line X—X of FIG. 3(a)
Figure 3:
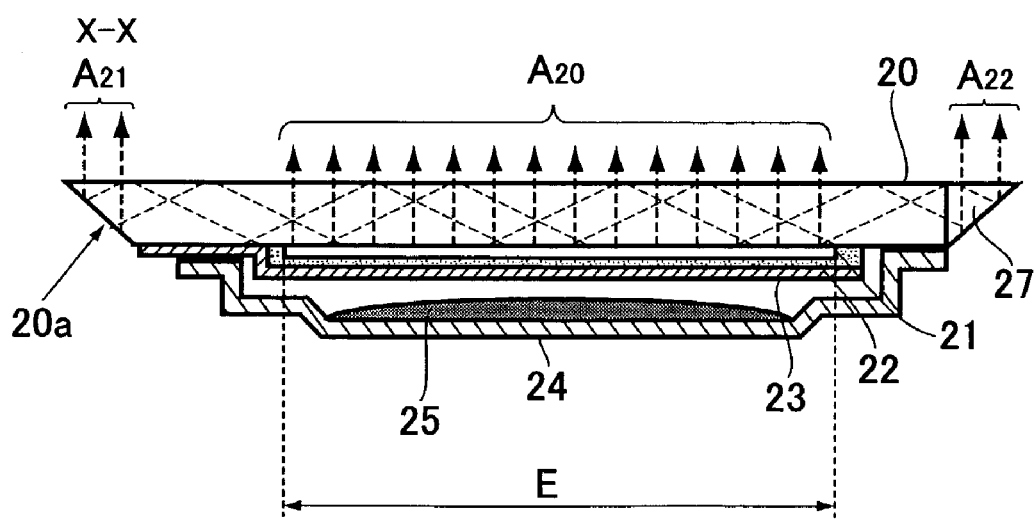
Figure 4:
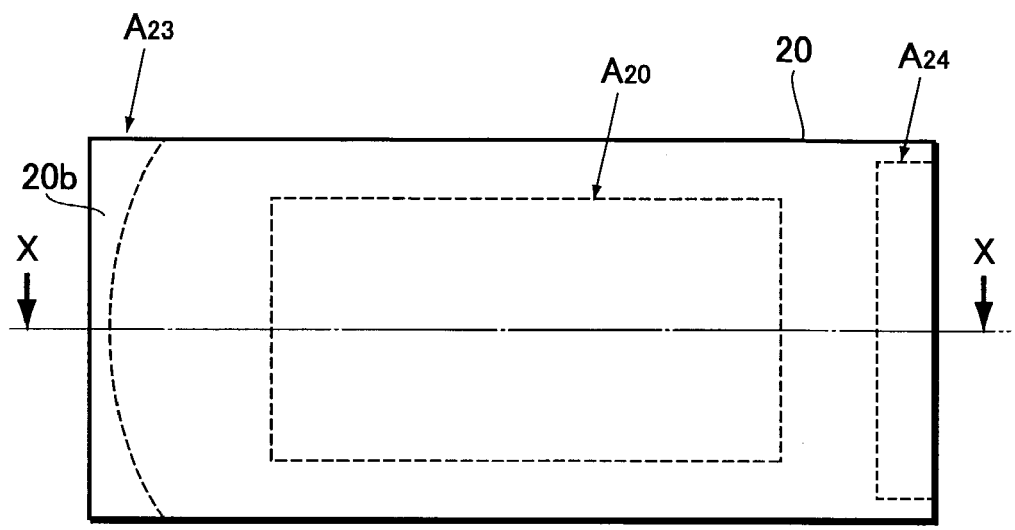
FIGS. 4(a) and 4(b) are explanatory views illustrating a light emitting device employed as a display device in an example of the present invention.
Figure 4:
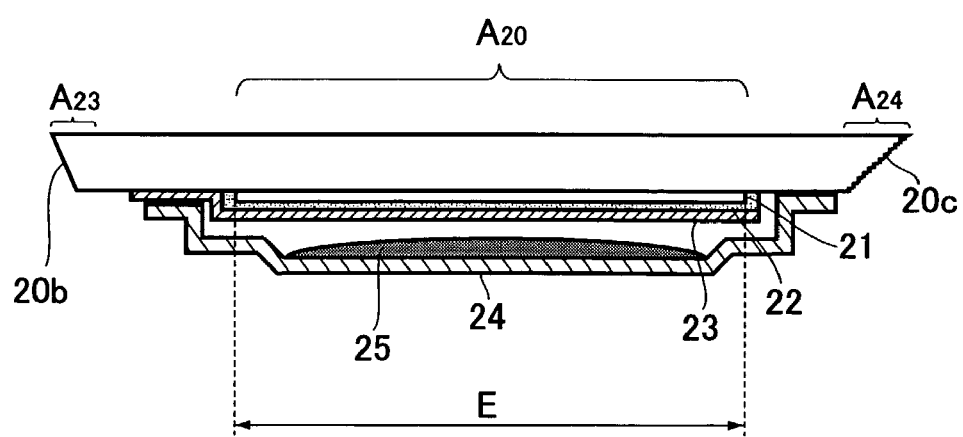

FIGS. 3(a) and 3(b) are explanatory views illustrating a light emitting device according to an example of the present invention. FIG. 3(a) is a plan view illustrating the light emitting device, FIG. 3(b) illustrating a cross-sectional view taken along the line X—X of FIG. 3(a). The following examples are described with reference to an organic EL display device, however, the present invention is not limited thereto.

Referring to FIGS. 3(a) and 3(b), on the lower surface of a transparent substrate 20, successively deposited are a first electrode layer or a transparent electrode layer 21 which is formed of ITO or the like and serves as the anode, a light emissive layer or an organic EL layer 22, and a second electrode layer or a metallic electrode layer 23 which is formed of Al or the like and serves as the cathode. In this configuration, the organic EL layer 22 are formed of layers, stacked upon each other from the anode, such as a hole injection layer of copper phthalocyanine, a hole transport layer of TDP or the like, a light-emitting layer or an electron transport layer of $Alq_3$ or the like, and an electron injection layer of $LiO_2$ or the like. The organic EL layer 22 is provided for a light emitting element region E corresponding to the region where the transparent electrode layer 21 is formed. In this example, although the transparent electrode layer 21 is formed in the shape of a single plane, the transparent electrode layer 21 may be formed in any shapes such as a segment, stripe, or dot matrix, with the light emitting element region E being divided into a plurality of pixel regions.

On the lower side of the transparent substrate 20, there is provided a sealing member 24, made of metal or glass, to cover the organic EL layer 22, which is hermetically sealed therein. There is also provided a hygroscopic agent 25 inside the sealing member 24 as required.

In this example, in the light emitting device principally configured as mentioned above, formed at one edge portion of the transparent substrate 20 is a cut face 20a with its face inside the substrate being oriented upwardly, while a prism-shaped reflective component 27 is connected to the edge at the other edge portion.

In this example, light beams which are emitted from the organic EL layer 22 by applying a voltage between the transparent electrode layer 21 and the metallic electrode layer 23 are transmitted toward the upper surface of the transparent substrate 20. At this time, a light beam incident generally perpendicularly on the transparent substrate 20 is to be transmitted out directly from the upper surface of the transparent substrate 20, thereby forming a display region $A_{20}$ on a surface region of the transparent substrate 20 opposite to the light emitting element region E. On the other hand, a light beam incident at an angle on the transparent substrate 20 is propagated through the transparent substrate 20 and is then reflected on the reflective surface of the cut face 20a and the reflective component 27, being transmitted toward the upper surface of the transparent substrate 20. On the surface of the transparent substrate 20, this causes light transmitting regions $A_{21}$, $A_{22}$ to be formed near the edge portions corresponding to the cut face 20a and the reflective surface of the reflective component 27. With this configuration, the transparent substrate 20 can be provided with a high refractive index, thereby allowing use to be made of total reflection so that light travels with a good efficiency.

According to a light emitting device of such an example, use is made of the display region $A_{20}$ as a display device, while the light transmitting regions $A_{21}$, $A_{22}$ can be provided with an auxiliary display function to provide improved functionality and design to the display device. Additionally, the light transmitting regions $A_{21}$, $A_{22}$ can transmit linear light beams out by making use of the width of the transparent substrate 20. This allows it to provide a linear light source function for use in a scanner light source or the like and to provide multi-functionality to electronic apparatus incorporating the light emitting device.

Furthermore, such light transmitting regions $A_{21}$, $A_{22}$ can be formed only by machining the transparent substrate 20 and attaching a reflective component thereto without having to form an additional light emitting element region. Thus, the light transmitting regions $A_{21}$, $A_{22}$ can be easily formed even at the edge portions of the substrate where it is difficult to form a light emitting element region.

To form the cut face 20a on the transparent substrate 20, a variety of cut faces such as a plane, mirror-finished, or ground-glass cut face may be employed as appropriate according to the application of the cut face 20a. It is also possible to provide improved design by carving a pattern on the plane. On the other hand, the shape, material (such as use of an emulsifying agent), and color of the reflective component to be attached can be selected as appropriate, thereby allowing for transmitting light out according to its application. Furthermore, an optical filter or a polarizing film may be affixed as required to the surface of the aforementioned display region $A_{20}$ and the light transmitting regions $A_{21}$, $A_{22}$. It is not always necessary to form the transparent substrate 20 of glass, but, for example, it may be formed of a flexible plastic substrate.

FIGS. 4(a) to 6(b) illustrate improved examples of the aforementioned example to be used as a display device. Like reference symbols indicate the same components as those of the aforementioned example throughout the figures, in which overlapped explanations are omitted in part. In an example in FIGS. 4(a) and 4(b), a curved cut face 20a is formed on one edge portion of the transparent substrate 20 to provide a light transmitting region $A_{23}$, while an irregularly reflective cut face 20c is formed on the other edge portion of the transparent substrate 20 to provide a light transmitting region $A_{24}$. This structure allows the light transmitting region $A_{23}$ to provide a curved linear light source, thereby enabling it to be used as a scanner light source for curved scanning. On the other hand, the light transmitting region $A_{24}$ makes it possible to provide a uniform planar light source.

Figure 5:
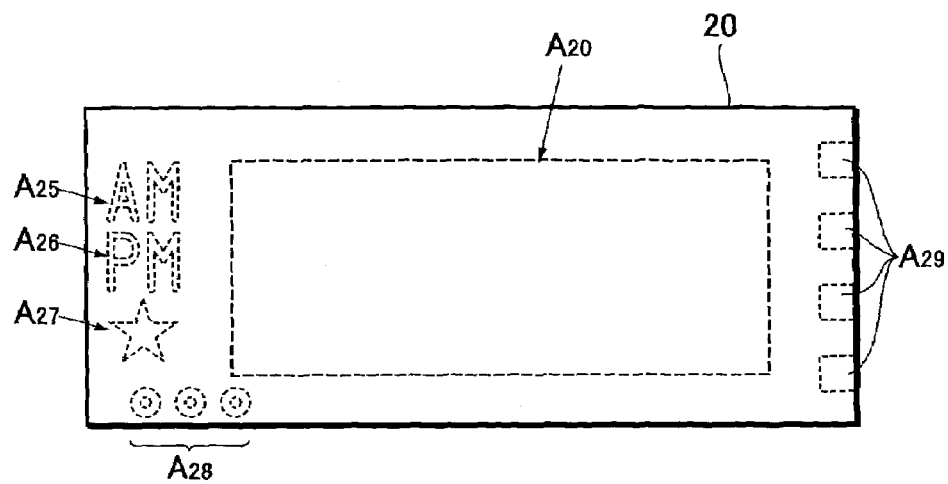
FIG. 5 is an explanatory view illustrating a light emitting device employed as a display device in an example of the present invention.
Figure 6:
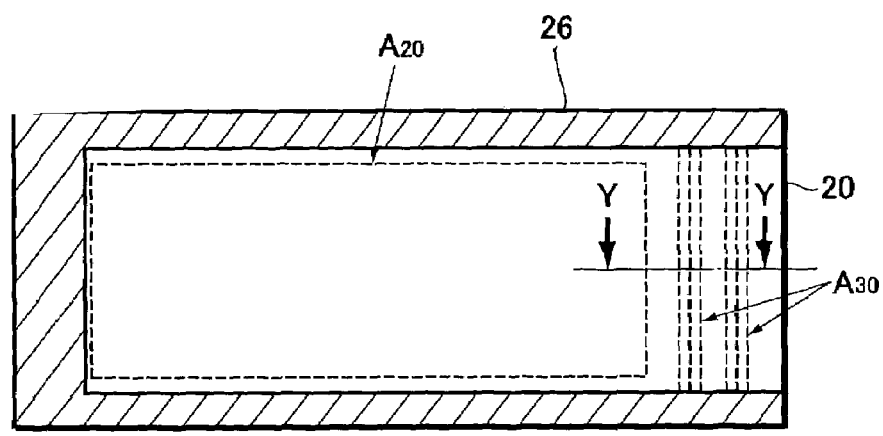
FIGS. 6(a) and 6(b) are explanatory views illustrating a light emitting device employed as a display device in an example of the present invention, FIG. 6(a) showing a plan view and FIG. 6(b) showing a cross-sectional view taken along the line Y—Y of FIG. 6(a)
Figure 6:
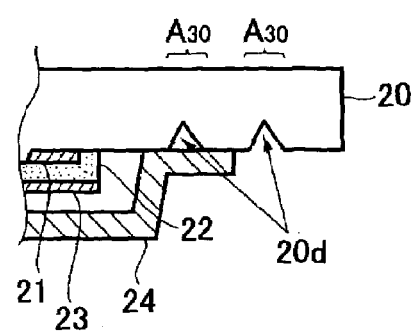

In an example of FIG. 5, there are formed grooves on the lower surface of the transparent substrate 20 to provide light transmitting regions $A_{25}$, $A_{26}$, $A_{27}$ in the shape of characters or graphics. Fluorescent materials for emitting different colors are applied to the lower surface of the transparent substrate 20 to form an arbitrarily shaped light transmitting region $A_{28}$. Additionally, cut faces are partially formed on one edge portion of the transparent substrate 20 to provide an icon-shaped light transmitting region $A_{29}$.

FIGS. 6(a) and 6(b) illustrate an example having a reflective coating 26 applied partially to the surface of the transparent substrate 20, in which FIG. 6(a) is a plan view and FIG. 6(b) is a cross-sectional view taken along the line Y—Y of FIG. 6(a). Additionally, there is formed an inverse V-shaped groove 20d on the lower surface of the transparent substrate 20 to provide a linear light transmitting region $A_{30}$. This structure makes it possible to reduce the loss of light launched from the surface of the transparent substrate 20 by applying the reflective coating 26 thereto, while allowing the groove 20d to provide a linear transmitted-out light beam in the simple configuration.

Figure 7:
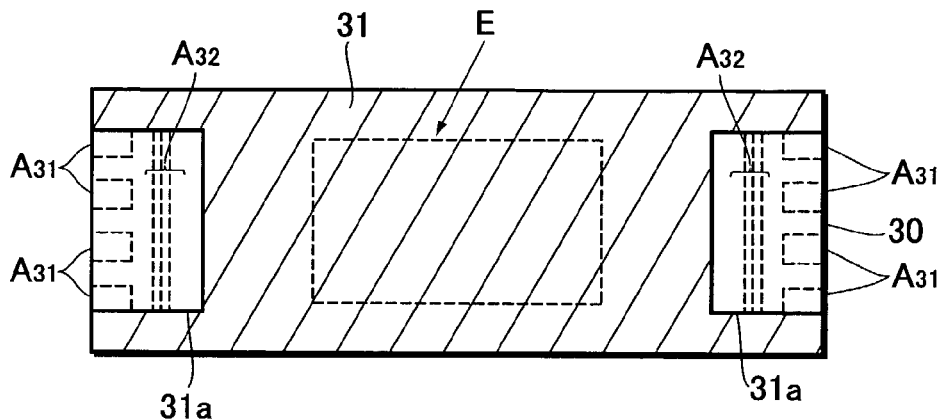
FIG. 7 is an explanatory view illustrating a light emitting device employed as a light source device in an example of the present invention.

FIGS. 7 to 12 show examples of light emitting devices for use in a light source device. In the example of FIG. 7, a reflective coating 31 is provided to cover the entire light emitting element region E which is formed on a transparent substrate 30 in the same manner as in the aforementioned example, while an opening portion 31a is formed at an edge portion of the transparent substrate 30. Additionally, light transmitting regions $A_{31}$, $A_{32}$ are formed so as to face this opening portion 31a. The light transmitting region $A_{31}$ is an icon-shaped region which is provided by forming a partial cut face on the edge portion of the transparent substrate 30. The light transmitting region $A_{32}$ is a linear region which is provided by forming an inverse V-shaped groove on the lower surface of the transparent substrate 30.

In a light emitting device according to such an example, a light beam emitted from the light emitting element region E and incident on the transparent substrate 30 is propagated through the transparent substrate 30 to be guided to the opening portion 31a. The light beam is then transmitted out in a predetermined form from the light transmitting regions $A_{31}$, $A_{32}$ which face the opening portion 31a. This makes it possible to facilitate emission of light from near an edge portion of the substrate where it is difficult to form the light emitting element region E. Furthermore, since the light emitting device employs a planar light emitting element region E, it is possible to form a light transmitting region which provides a uniform intensity within the region.

Figure 8:
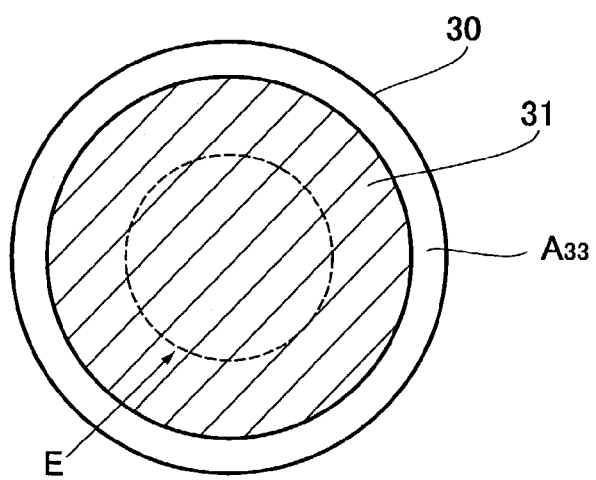
FIGS. 8(a) and 8(b) are explanatory views illustrating a light emitting device employed as a light source device in an example of the present invention.
Figure 8:
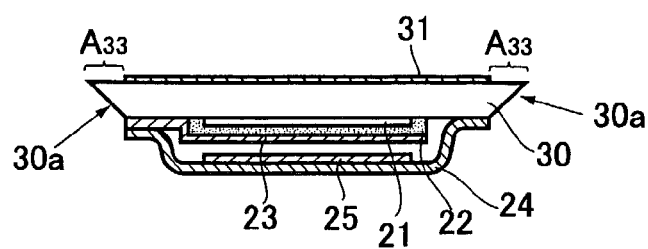

An example of FIG. 8 employs a circular transparent substrate 30 to form a circular light transmitting region $A_{33}$ in order to provide an annular emission of light. The structure of the light emitting element region E is the same as that of the aforementioned example, wherein like reference symbols indicate like components and overlapped explanations are omitted. The circular reflective coating 31 is applied to cover the light emitting element region E, leaving only the periphery of the transparent substrate 30 open. There is provided a light transmitting region $A_{33}$ having a cut face 30a formed on the edge portion of the transparent substrate 30 so as to face the periphery.

Figure 9:
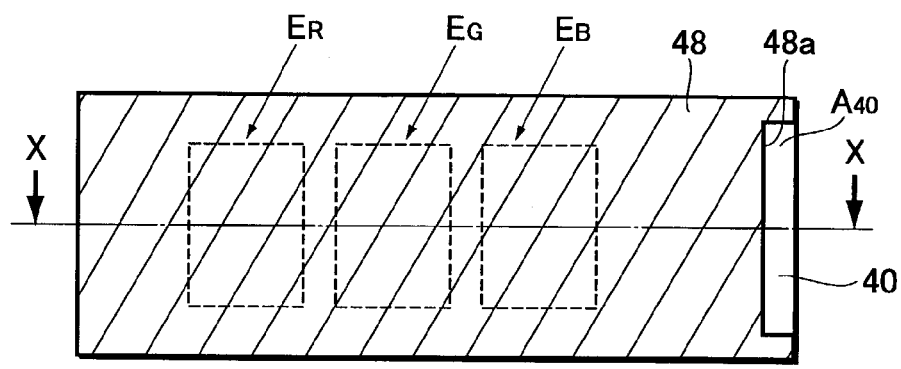
FIGS. 9(a) and 9(b) are explanatory views illustrating an example of a light emitting device having color light emitting element regions and employed as a light source device.
Figure 9:
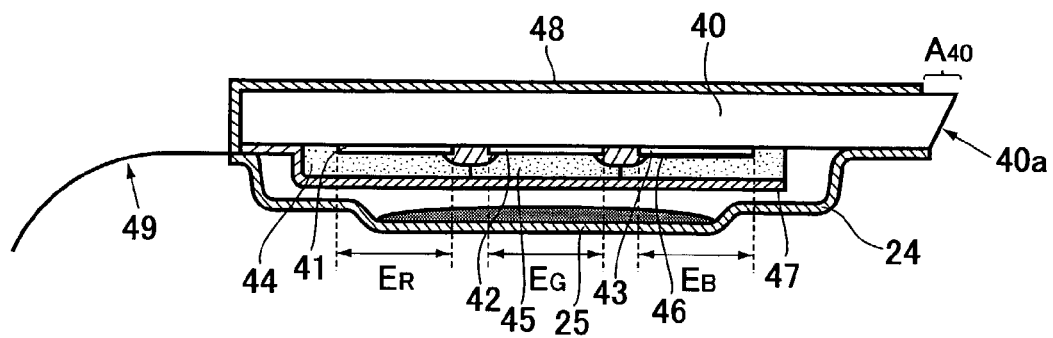

FIGS. 9(a) to 12 illustrate examples of a light emitting device which has color light emitting element regions and is used as a light source device. Like reference symbols indicate the same components as those of the aforementioned examples throughout the figures, in which overlapped explanations are omitted in part. FIGS. 9(a) and 9(b) show an example, FIG. 9(a) is a plan view and FIG. 9(b) is a cross-sectional view taken along the line X—X of FIG. 9(a). In this constitution, three regions or transparent electrode layers 41, 42, 43 are defined on the lower surface of a transparent substrate 40, in which organic EL layers 44, 45, 46 of R (red), G (green), and B (blue) are deposited on the transparent electrode layers 41, 42, 43, respectively. There is also provided a metallic electrode layer 47 uniformly on the organic EL layers 44, 45, 46, which have their respective color. There are also formed three light emitting element regions $E_R$, $E_G$, $E_B$ corresponding to the regions where the transparent electrode layers 41, 42, 43 are formed.

In this example, the surface of the transparent substrate 40 is covered with a reflective coating 48 and the sealing member 24 except for an opening portion 48a formed at an edge portion on the upper surface of the transparent substrate 40. Furthermore, a cut face 40a is formed corresponding to the opening portion 48a to provide a linear light transmitting region $A_{40}$.

Accordingly, light beams which are incident on the transparent substrate 40 from each of the light emitting element regions $E_R$, $E_G$, $E_B$ are combined into a light beam of a color while propagating through the transparent substrate 40. The light beam of the combined color is to be transmitted out linearly from the light transmitting region $A_{40}$. This example is adapted to supply a voltage applied between the transparent electrode layers 41, 42, 43 and the metallic electrode layer 47 via a flexible lead wire 49 connected to wiring portions (not shown) which are coupled to the transparent electrode layers 41, 42, 43 and the metallic electrode layer 47, respectively. It is also possible to provide control on individual voltages to be applied to each of the light emitting element regions $E_R$, $E_G$, $E_B$ in order to independently turn on or off the light emission from each of the light emitting element regions $E_R$, $E_G$, $E_B$.

This makes it possible to adjust the amount of light emission from each of the light emitting element regions $E_R$, $E_G$, $E_B$, thereby providing a white combined beam of light transmitted out from the light transmitting region $A_{40}$. It is also possible to turn on any one of the light emitting element regions $E_R$, $E_G$, $E_B$ with the others being turned off, thereby allowing a light beam of only a single color out of R, G, and B to be transmitted out. Furthermore, it is also possible to adjust the amount of light emission of each color from the respective light emitting element regions $E_R$, $E_G$, $E_B$, or alternatively to adjust the amount of light emission from each of any selected two light emitting element regions with the other being turned off. This allows the device to appropriately adjust and transmit a combined color of R, G, and B, or a combined color (mixed color) such as RG, GB, or RB out. In this example, the light emitting element regions of three colors R, G, and B are formed. However, it is also possible to form light emitting element regions of two colors RG, GB, and RB in the same structure, allowing the color of transmitted-out light to be adjusted in the same manner.

Figure 10:
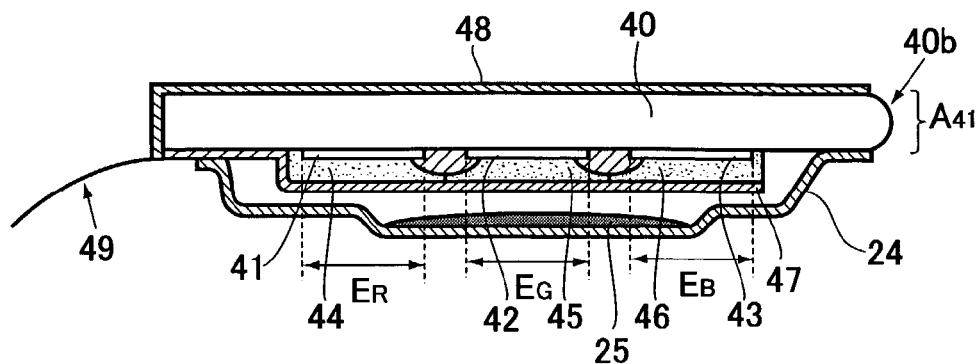
FIG. 10 is an explanatory view illustrating an example of a light emitting device having color light emitting element regions and employed as a light source device.

An example of FIG. 10 is an improved one derived from the example of FIG. 9, wherein like reference symbols indicate like components and overlapped explanations are omitted in part. In this example, there is provided an opening portion at one end surface of the transparent substrate 40, with the end surface being turned into a lens-formed face 40b to provide a light transmitting region $A_{41}$. This structure makes it possible to transmit a condensed light beam out from the end surface of the transparent substrate 40.

Figure 11:
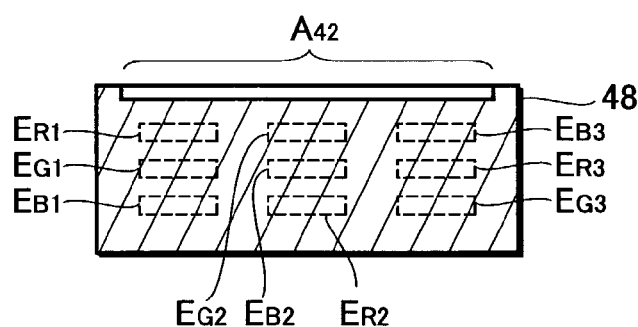
FIG. 11 is an explanatory view illustrating an example of a light emitting device having color light emitting element regions and employed as a light source device.

An example of FIG. 11 is another improved example from the example of FIG. 9. In this example, there are provided light emitting element regions ($E_{R1}$, $E_{G1}$, $E_{B1}$, $E_{R2}$, $E_{G2}$, $E_{B2}$, $E_{R3}$, $E_{G3}$, $E_{B3}$) arrayed in a matrix. This arrangement allows a wide light transmitting region $A_{42}$ to transmit a light beam of more uniformly combined colors therefrom. This arrangement also makes it possible to provide finer control on the combination of colors by appropriately adjusting the output from the multi-array light emitting element regions.

Figure 12:
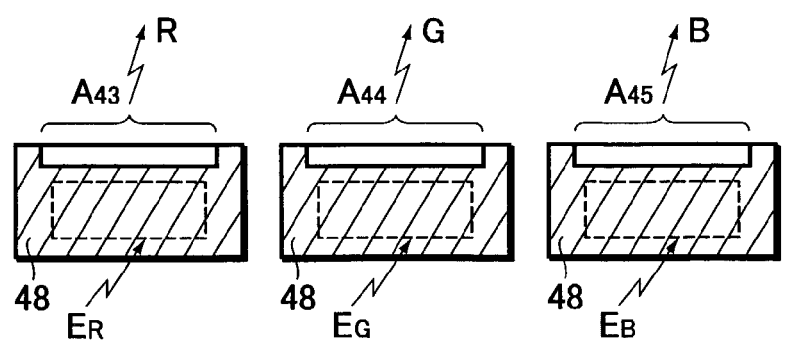
FIG. 12 is an explanatory view illustrating an example of a light emitting device having color light emitting element regions and employed as a light source device.

In an example of FIG. 12, the light emitting element regions $E_R$, $E_G$, $E_B$ each having a single color are formed in individual light emitting devices, respectively, so as to provide a single color (R, G, and B) from a light transmitting region $A_{43}$, $A_{44}$, $A_{45}$ of the respective light emitting devices. These light emitting devices are arranged side by side to provide a single color or combined-color transmissions of light.

Figure 13:
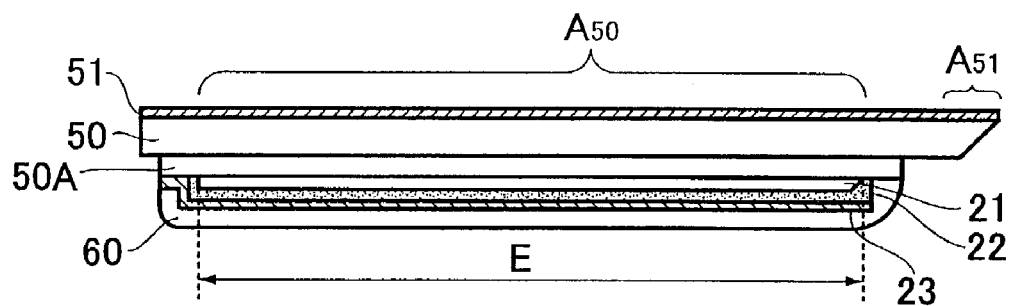
FIG. 13 is an explanatory view illustrating an example of a light emitting device which employs a flexible transparent substrate to provide flexibility to the entire light emitting device.

An example shown in FIG. 13 employs a flexible transparent substrate to provide flexibility to an entire light emitting device. In this example also, the aforementioned transparent electrode layer 21, the organic EL layer 22, and the metallic electrode layer 23 are deposited on a flexible transparent film substrate 50A to provide the light emitting element region E. The metallic electrode layer 23 has a plastic sealing film 60 applied thereto. There is further provided a flexible transparent substrate 50 of plastic or the like affixed to the transparent film substrate 50A. In this example, the transparent substrate 50 having a light transmitting region $A_{51}$ formed at a region other than a display region $A_{50}$ is prepared separately from the transparent film substrate 50A on which the light emitting element region E is formed. This facilitates machining of the transparent substrate 50 and forming of an optical film 51 (such as a filter or polarizing film) on its surface. Furthermore, to meet the requirements for a thin and flexible device, it is also possible to employ only the transparent film substrate 50A and form the light transmitting region $A_{51}$ thereon.

The light emitting devices according to these embodiments and examples make it possible to facilitate fabrication, enable it to make an effective use of the entire transparent substrate as a light transmitting region, enable it to make an effective use of light emitted from the light emitting element region, facilitate formation of the light transmitting region with ease, and enable it to achieve an improved functionality and design of the light emitting element.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A light emitting device having a first electrode layer, a light emissive layer, and a second electrode layer, said layers being directly mounted on one surface of a transparent substrate to form a planar light emitting element region on said transparent substrate, comprising:

a light transmitting region for transmitting out light having been emitted from said light emitting element region and having been propagated in a lateral direction through said transparent substrate, wherein said light transmitting region is formed near an edge of said transparent substrate and at a region other than a region opposite to said light emitting element region on another surface of said transparent substrate and is constituted by a groove or a cut face formed on said transparent substrate.

2. The light emitting device according to claim 1, wherein a part of the surface or an entire surface of said transparent substrate except for said light transmitting region is coated with a reflective coating.

3. The light emitting device according to claim 2, wherein said light transmitting region is linearly shaped to form a linear light source of a light beam transmitted out from said light transmitting region.

4. The light emitting device according to claim 2, wherein said light emitting element region is defined as a plurality of light emitting element regions each having a different color, and light beams emitted from said light emitting element region are combined to be transmitted out through said light transmitting region.

5. The light emitting device according to claim 4, wherein an emission of light from said light emitting element region is controllably turned on or off to make a combined color adjustable, said combined color being provided by a light beam transmitted out through said light transmitting region.

6. The light emitting device according to claim 2, wherein said light emissive layer is an organic electroluminescence layer.

7. The light emitting device according to claim 1, wherein said light transmitting region is linearly shaped to form a linear light source of a light beam transmitted out from said light transmitting region.

8. The light emitting device according to claim 1, wherein said light emitting element region is defined as a plurality of light emitting element regions each having a different color, and light beams emitted from said light emitting element region are combined to be transmitted out through said light transmitting region.

9. The light emitting device according to claim 8, wherein an emission of light from said light emitting element region is controllably turned on or off to make a combined color adjustable, said combined color being provided by a light beam transmitted out through said light transmitting region.

10. The light emitting device according to claim 1, wherein said light emissive layer is an organic electroluminescence layer.

11. A light emitting device comprising a first electrode layer, a light emissive layer, and a second electrode layer, said layers being directly mounted on one surface of a transparent substrate to form a planar light emitting element region on said transparent substrate, wherein on another surface of said transparent substrate, a display region is formed at a region opposite to said light emitting element region, and in addition to said display region, further formed is a light transmitting region for transmitting out light having been emitted from said light emitting element region and having been propagated in a lateral direction through said transparent substrate, and wherein said light transmitting region is formed near an edge of said transparent substrate and at a region other than a region opposite to said light emitting element region on the other surface of said transparent substrate and is constituted by a groove or a cut face formed on said transparent substrate.

12. The light emitting device according to claim 11, wherein said light emitting element region is defined as a plurality of light emitting element regions each. having a different color, and light beams emitted from said light emitting element region are combined to be transmitted out through said light transmitting region.

13. The light emitting device according to claim 11, wherein said light emissive layer is an organic electroluminescence layer.

14. A light emitting device having a first electrode layer, a light emissive layer, and a second electrode layer, said layers being directly mounted on one surface of a first transparent substrate to form a planar light emitting element region on said first transparent substrate, comprising:

a second transparent substrate mounted on said first transparent substrate, one surface of said second transparent substrate directly contacting with another surface of said first transparent substrate; and a light transmitting region for transmitting out light having been emitted from said light emitting element region and having been propagated in a lateral direction through said first and second transparent substrates, wherein said light transmitting region is formed near an edge of said second transparent substrate and at a region other than a region opposite to said light emitting element region on another surface of said second transparent substrate and is constituted by a groove or a cut face formed on said second transparent substrate.

15. The light emitting device according to claim 14, wherein said light emitting element region is defined as a plurality of light emitting element regions each having a different color, and light beams emitted from said light emitting element region are combined to be transmitted out through said light transmitting region.

16. The light emitting device according to claim 14, wherein said light emissive layer is an organic electroluminescence layer.

* * * * *